(12) United States Patent
Greiner

(10) Patent No.: US 7,237,920 B2
(45) Date of Patent: Jul. 3, 2007

(54) ORGANIC ELECTROLUMINESCENT LIGHT SOURCE WITH ANTI-REFLECTION COATING

(75) Inventor: Horst Greiner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/534,319

(22) PCT Filed: Nov. 3, 2003

(86) PCT No.: PCT/IB03/04954

§ 371 (c)(1),
(2), (4) Date: Mar. 13, 2006

(87) PCT Pub. No.: WO2004/044999

PCT Pub. Date: May 27, 2004

(65) Prior Publication Data

US 2006/0220518 A1    Oct. 5, 2006

(30) Foreign Application Priority Data

Nov. 12, 2002 (DE) .............................. 102 52 903

(51) Int. Cl.
*F21K 2/00* (2006.01)
(52) U.S. Cl. .................................................... 362/84
(58) Field of Classification Search ................... 362/84
See application file for complete search history.

(56) References Cited

U.S. PATENT DOCUMENTS 6,762,553 B1 * 7/2004 Yokogawa et al. ......... 313/509
2004/0252099 A1 * 12/2004 Walder et al. .............. 345/105

FOREIGN PATENT DOCUMENTS

EP         1 153 739 A1    11/2001

* cited by examiner

*Primary Examiner*—Laura K. Tso

(57) ABSTRACT

Organic electroluminescent light source having a front panel 1, a front electrode member 8, 3, a counterelectrode member 5, an organic electroluminescent member 6, 7 between the front electrode member and the counterelectrode member, and an antireflection layer 2 consisting of an organic polymer material which comprises mesopores.

6 Claims, 1 Drawing Sheet

ORGANIC ELECTROLUMINESCENT LIGHT SOURCE WITH ANTI-REFLECTION COATING

Figure 1:
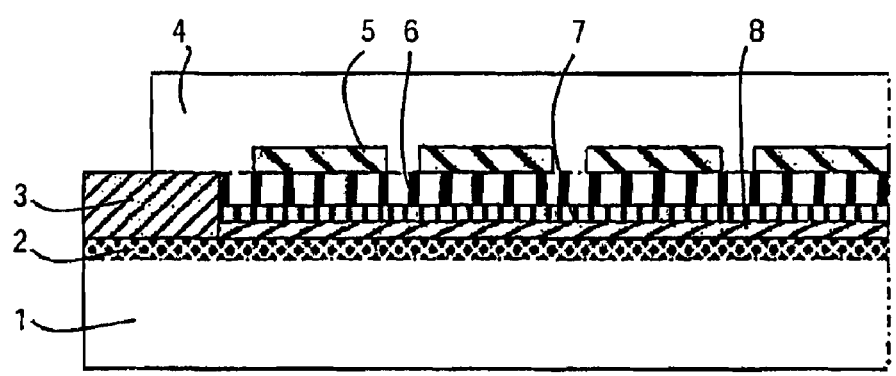

The invention relates to an organic electroluminescent light source, in particular an organic electroluminescent diode for light displays, lights, solid-state image intensifiers or screens. The organic electroluminescent light source comprises a transparent front panel, a front electrode member, a counterelectrode member, an organic electroluminescent member between the front electrode member and the counterelectrode member, and an antireflection layer consisting of a material which has pores.

An electroluminescent light source is characterized in that it transmits light when an electric voltage is applied under current conduction. The following light-generating processes are performed: when electrons are injected into a p-doped semiconductor, light may be generated when the electron recombines with the hole, with radiation being emitted. Conversely, in the case of hole injection into n-doped semiconductor material, light may be generated when the holes recombine with the electrons, with light being emitted.

Prior art LEDs are usually inorganic semiconductor diodes, that is to say that inorganic semiconductors such as doped zinc sulfide, silicon, germanium or III–V semiconductors, e.g. InP, GaAs, GaAlAs, GaP or GaN with appropriate dopings, are used as diodes for making them. Punctiform display elements can be produced on the basis of such substances. Large-surface arrangements are not possible.

For some years, work has been carried out to develop luminescent radiation sources the emitter material of which is not an inorganic semiconductor but rather an organic electroluminescent material.

Electroluminescent light sources with luminous layers made of organic materials are considerably superior, in respect of some properties, to light sources comprising inorganic materials. One advantage is their easy deformability and high elasticity which makes new applications possible, for instance for lighting, light displays and screens. These luminous layers may easily be produced as large-surface, flat and very thin layers which in addition make use of a small amount of material. They are also characterized by a notably high brightness while at the same time having a low drive voltage.

The lumen output of an electroluminescent light source is determined by the quantum efficiency of all light-generating processes. The internal quantum efficiency stems from the percentage of injected charge carriers that recombine to emit radiation. The external quantum efficiency results from the internal quantum efficiency multiplied by the percentage of light that actually emerges from the semiconductor.

In contrast to the light-generating processes in conventional light sources, which are initiated by gas discharge or plasma discharge, the actual light-generating process in electroluminescent light sources is almost free of losses.

Whereas, therefore, the internal quantum efficiency of electroluminescent light sources is very high, there is a series of loss factors in respect of the external quantum efficiency.

One of the loss factors is the low light decoupling, which is brought about by the complex layer structure of the electroluminescent light sources consisting of a number of layers with different refractive indices.

When light impinges with an angle of incidence R on the interfaces between two layers with different refractive indices, from the layer with the higher refractive index ($n_2 > n_1$), a reflected ray of light and a diffracted ray of light are generated. Under unfavorable conditions, no diffracted ray of light is generated but rather only a reflected ray of light.

The different optical refractive indices of the materials in organic electroluminescent light sources actually cause the light generated in the active layer of the light source to be totally reflected upon emergence on account of the high refractive index of the organic electroluminescent materials and to be decoupled only to a few percent into the exterior space, typically air, with a lower refractive index. Given a predefined electrical current which flows through the electroluminescent light source to generate light, the brightness of the light source is thus limited.

In order to improve the decoupling of light, it is known to add layers with a lower refractive index to the layer structure of the electroluminescent light source.

By way of example, EP 1153739 discloses an electroluminescent optical member, the substrate of which comprises a functional layer, an aerogel layer and an interlayer between the functional layer and the aerogel layer. The aerogel may be a silica gel having a refractive index of between 1.008 and 1.3.

The high absorbability of silica gel for liquids and gases is problematic. The water- and vapor-permeability of such aerogel layers means that the quality and service life of the electroluminescent optical member are limited.

It is an object of the present invention to specify an electroluminescent light source for different material systems which is suitable for mass production, is able to decouple as much light as possible and is resistant to environmental influences.

According to the invention, this object is achieved by an organic electroluminescent light source having a front panel, a front electrode member, a counterelectrode member, an organic electroluminescent member between the front electrode member and the counterelectrode member, and an antireflection layer consisting of an organic polymer material which comprises mesopores, between the front panel and the front electrode member.

The pore size of the mesopores is in the range of 50 to 100 nm. This pore size ensures that the evanescent waves at the interface between the front electrode member and the antireflection layer, which stem from those photons trapped in the electroluminescent member, can be effectively coupled into the antireflection layer.

The mesoporous antireflection layer has a low effective refractive index so that the decoupling of light out of the mesoporous antireflection layer into the adjoining front panel is also advantageously improved.

The antireflection layer according to the invention meets the requirement for sufficient optical transparency, long-term stability against the elements and against changes in temperature.

According to one preferred embodiment of the invention, the mesopores comprise closed cells and are uniformly dispersed in the antireflection layer.

According to a further embodiment of the invention, the organic polymer material of the antireflection layer is a hydrophobic polymer.

Antireflection layers consisting of a hydrophobic organic polymer and comprising closed-cell pores prevent the absorption of oxygen and water into the organic electroluminescent light source. They thereby prevent oxidation of the organic semiconductor layers and of the electrodes which consist of base metals, leading to a reduction in the service life of the organic electroluminescent light sources.

In the context of the present invention, the pores may also comprise macropores.

The pores in the antireflection layer are preferably produced by means of a porogen.

It is furthermore preferred that the light-emitting areas of the organic electroluminescent light source are essentially areas that emit two-dimensionally.

The invention will be further described with reference to an example of embodiment shown in the drawing to which, however, the invention is not restricted.

FIG. 1 shows the schematic structure of an organic electroluminescent light source according to the invention.

An organic electroluminescent light source according to the invention is generally constructed as follows: the core piece is an organic electroluminescent member between a positive electrode as front electrode member and a negative electrode as counterelectrode member, where one or both electrode members may be transparent and/or segmented.

The organic electroluminescent light source is provided with a front panel and usually also a rear panel.

According to the invention, an antireflection layer consisting of a porous, polymeric organic material which comprises mesopores is arranged between the front electrode member and the front panel.

This structure represents the most common case and may be supplemented by further layers; by way of example the organic electroluminescent member may be divided into individual layers with different functions such as hole injection layer, hole transport layer, light-emitting layer, electron transport layer and electron injection layer.

By way of example, one or more electron injection and/or electron transport layers may be arranged between the electroluminescent layer and the positive electrode. Likewise, one or more hole injection and/or hole transport layers may be arranged between the electroluminescent layer and the negative electrode.

A complete organic electroluminescent light source may furthermore comprise contacts, a covering and encapsulation.

Typically, such a light source consists of a layer composite of individual layers applied on top of one another and sometimes next to one another. All layer structures and materials for these layers that are known to the person skilled in the art may be used.

This layer composite may be constructed starting from the front panel made of glass, quartz, ceramic, artificial resin or a transparent, flexible plastic film.

Preferred materials for producing the front panel are glass and plastic. The particular advantages of glass are that it is chemically and also photochemically inert, is optically isotropic, is temperature-stable, is mechanically stable and also has a hard surface. However, glass has a relatively high density, is brittle and is therefore very fragile. Plastics, e.g. polyimides, polyethylene terephthalates and polytetrafluoroethylenes, have a lower density and are elastic and resistant to breaking.

The negative electrode supplies electrons which combine with the holes coming from the positive electrode in the organic electroluminescent layer to form excitons and emit photons upon recombination.

At least one of the electrode members should be transparent or at least translucent. Usually, the positive electrode is the front electrode and is made of a non-stoichiometric or doped tin oxide, e.g. ITO, or a metal with a high work function, e.g. gold or silver. These electrode materials may easily be made as transparent layers. ITO is particularly suitable on account of the fact that it has good electrical conductivity and is transparent.

Likewise, a layer of a conductive polyaniline or poly-3, 4-ethylene dioxythiophene may be used alone or together with an ITO layer as transparent positive electrode.

The negative electrode, which injects electrons into the organic electroluminescent layer, should have a low work function. Suitable materials for the negative electrode are, for example, indium, aluminum, calcium, barium or magnesium. If the negative electrode is made of reactive barium, it is recommended that this electrode layer be covered with a further protective layer of an epoxy resin or an inert metal. These layers have the advantage that they are not as highly reflective as metallic layers.

Aromatic, conjugated ladder polymers of poly(para-phenylene) type (LPPPs), which are chemically similar to oligo- or polyphenylene, have proven to be particularly suitable as organic electroluminescent member for use in organic electroluminescent light sources. LPPPs have a continuous chain of conjugated double bonds. Particularly suitable are, for example, soluble poly(phenylene ethylene vinylene)s and soluble polythiophenes, in particular poly(phenylene vinylene)s which are further substituted on the phenyl ring in the 2- and 5-position with alkyl or alkoxy radicals. Such ladder polymers can be easily processed and produce layers with an amorphous structure. Examples of suitable poly (phenylene vinylene)s are poly(2-methyl-5-(n-dodecyl)-p-phenylene vinylene), poly(2-methyl-5-(3,5-dimethyloctyl)-p-phenylene vinylene), poly(2-methyl-5-(4,6,6-trimethylheptyl)-p-phenylylene vinylene), poly(2-methoxy-5-dodecyloxy-p-phenylene vinylene) and poly(2-methoxy-5-(ethylhexyloxy)-p-phenylene vinylene) (MEH-PPV).

Devices which comprise two different electroluminescent layers work considerably better than organic electroluminescent light sources with a single electroluminescent layer. One layer transports holes effectively, e.g. PPV, and one layer transports electrons effectively, e.g. oxadiazole. As a result, holes and electrons can then recombine more easily.

Polyethylene dioxythiophene PEDOT and polyethylene dioxythiophene polystyrenesulfonate PEDOT-SS are particularly advantageous for transporting the positive charge carriers. 4,4',4"-Tris[N-(1-naphthyl)-N-phenylamino]triphenylamine together with hydroxyquinoline aluminum III salt $Alq_3$ as emission and electron transport material is also particularly advantageously used to transport the positive charge carriers.

In respect of organic electroluminescent optical members, the literature sometimes distinguishes between polyLEDs and OLEDs. OLEDs comprise an organic electroluminescent member based on sputtered low molecular weight organic compounds. PolyLEDs comprise an organic electroluminescent member based on long-chain organic electroluminescent polymers which are applied by dipping, spin coating or printing.

According to the invention, the organic electroluminescent light source comprises an antireflection layer consisting of an organic polymer material, into which mesoporous, preferably uniformly dispersed pores are introduced.

Within the context of the present invention, organic polymers, copolymers and polymer mixtures, such as polyacrylamides, polyacrylates, vinyl polymers or polystyrene/ divinylbenzene copolymers for example, may be used as organic polymer materials. By way of example, poly(meth) acrylic acid derivatives, polystyrene derivatives, polyesters, polyamides or polyethylenes may also be used.

Within the context of the present invention, organic polymer materials are also in particular synthetic hydrophobic and non-degrading polymers, copolymers and polymer mixtures of polymethyl methacrylates, polycarbonates, polypropylene oxides, polyamides, polyvinylidene fluorides, polybutylenes and polyacrylonitriles.

These polymers may be produced from the monomers for example by free radical, ionic or thermal polymerization. In some methods of producing polymers, no monomers are used as starting compounds but rather oligomeric or polymeric compounds are used. According to the invention, the term "monomers" therefore also includes oligomeric or low polymeric compounds which can be polymerized and can be used as starting compounds for the polymerization of organic materials.

The monomers which are to be used are known to the person skilled in the art in the field of organic polymers.

In order to lower the refractive index of the organic polymer material, mesopores are introduced into the material.

Porous materials may be characterized by their pore size. According to IUPAC nomenclature, very small pores with a diameter<2 nm are referred to as micropores whereas very large pores with a diameter>50 nm are referred to as macropores.

Pores of intermediate diameter with a diameter of between 2 and 50 nm are referred to as mesopores and form one aspect of the present invention. Preferably, mesoporous organic and hydrophobic materials which comprise exclusively uniformly dispersed closed-cell mesopores are used for the layers according to the invention, although porous materials with fractions of macropores may also be suitable. A network of open pores may also be suitable.

The greater the number and the smaller the size of the pores, the lower the refractive index and the better the optical transmission.

The pore diameter may be determined by gas adsorption and electron microscopy. The mesopores should have a diameter with a median value of at least 1 nm and at most 50 nm, preferably at least 30 nm and at most 50 nm. The size of the pores affects the transparency of the coating.

Particularly transparent coatings are obtained with small mesopores, which have a diameter for example of at most 100 nm, more preferably 50 nm. The refractive index of the antireflection layer is determined by the size and number of pores.

According to one embodiment of the invention, the antireflection layer additionally also comprises macropores, preferably macropores in an amount of the same order of magnitude as that of the mesopores.

The antireflection layer may be produced by a method of producing porous organic polymers with a defined porosity using a pore-forming agent.

Suitable as pore-forming agents are physically active foamers, chemically active propellants and blowing agents and also porogens.

Within the context of the present invention, it is preferred to produce the coatings from a polymer material comprising mesopores by carrying out the polymerization in the presence of a material that is inert with respect to the polymer, said material often being referred to as a porogen. Following the polymerization, the porogen is dissolved out of the polymer. As a result, cavities are produced in the polymer.

The material of the porogen may be selected from natural and synthetic materials which during polymerization either retain their shape or form a dimensionally stable separate phase and can then be removed again. By way of example, porogens which are water-soluble or can be dissolved in solvents that do not attack the polymer are suitable.

Porogens which are suitable for the invention may be water-soluble salts such as sodium chloride, potassium chloride, sodium fluoride, potassium fluoride, sodium iodide, sodium nitrate, sodium sulfate, sodium iodate and mixtures thereof, other water-soluble chemical compounds such as sodium hydroxide, and various water-soluble sugars such as saccharin, glucose and fructose.

The water-soluble porogen may be used in any desired geometric shape, e.g. in the form of spheres, fibers, lamina and in the conventional regular and irregular shapes of crystals.

The porogen may also be a further organic polymer which is incompatible with the first organic polymer (which forms the antireflection layer) and forms with the latter an incompatible, dispersed liquid phase.

The morphology and porosity of the antireflection layer may be controlled by the ratio of incompatible porogen to the first organic polymer. A high fraction of porogen leads to an open sponge-like structure and a medium fraction leads to a network of more or less linked pores. A closed-cell, defined pore structure is obtained with a low fraction of porogen.

The coating solution for producing the antireflection layer usually comprises the organic polymer or a precursor of the polymer and also the porogen in a solvent. The coating solution typically comprises 30 to 80% by volume of porogen.

When a porogen in the form of an organic incompatible polymer is used, then when the coating solution is prepared from the two incompatible polymers in a solvent a significant part of the porogen is retained as discrete phase and forms a dispersion with the first polymer before the polymerization is started. The first polymer typically comprises at least 50% of the porogen, so that after polymerization an open-cell network of pores is formed.

The person skilled in the art is able to combine the various polymers or monomers in a suitable manner, where appropriate to select a suitable radical starter or initiator and thus produce a monomer solution. The duration and temperature of polymerization are adapted to the respective monomer solution in accordance with conventional rules.

The coating solution is applied to the inner side of the front panel by known spin-on deposition methods or by simple dipping of the entire specimen.

Following termination of the polymerization step, the material of the porogen is dissolved out of the resulting coating which consists of the organic matrix polymer and the porogen. The dissolution process may also include an evaporation, solvent extraction or leaching, depending on the type of porogen selected.

Following further washing steps to remove the washing solution, the mesoporous organic polymer antireflection layer is obtained.

EXAMPLE OF EMBODIMENT

The embodiment, shown in FIG. 1, of the organic electroluminescent light source with an antireflection layer consisting of a mesoporous organic polymer material consists essentially of a front panel 1 onto which a transparent and conductive ITO layer 8 with contact connections 3 has been applied as front electrode. On the ITO layer there is an electroluminescent layer 7 of PDOT and a second electroluminescent layer 6 of PPV and a counterelectrode made of aluminum 5. The structure is closed by a rear panel 4. The organic electroluminescent light source furthermore comprises the mesoporous antireflection layer 2 between the optically transparent front panel 1 and the electroluminescent layers 6, 7.

The organic electroluminescent layers 6, 7 have a refractive index of 1.8 and the ITO electrode layer has a refractive index of 1.7. The mesoporous antireflection layer has a thickness of a few micrometers and a refractive index of <1.25, and the glass of the front panel has a refractive index of 1.46 to 1.5.

Even without further embodiments, it is assumed that a person skilled in the art is able to use the above description to the broadest extent. The preferred embodiments and the example are therefore only to be regarded as a descriptive and in no way limiting disclosure.

The invention claimed is:

1. An organic electroluminescent light source having a front panel, a front electrode member disposed adjacent the front panel, a counterelectrode member, an organic electroluminescent member disposed between the front electrode member and the counterelectrode member, and an antireflection layer disposed between the front panel and the front electrode member, said antireflection layer consisting essentially of an organic polymer material which comprises mesopores.

2. An organic electroluminescent light source as claimed in claim 1, characterized in that the mesopores comprise closed cells and are uniformly dispersed in the antireflection layer.

3. An organic electroluminescent light source as claimed in claim 1, characterized in that the antireflection layer includes macropores.

4. An organic electroluminescent light source as claimed in claim 1, characterized in that the organic polymer material is hydrophobic.

5. An organic electroluminescent light source as claimed in claim 1, characterized in that the mesopores in the antireflection layer are produced by means of a porogen.

6. An organic electroluminescent light source as claimed in claim 1, characterized in that the light-emitting areas are essentially areas that emit two-dimensionally.

* * * * *